United States Patent [19]

Nasu et al.

[11] Patent Number: 5,591,663
[45] Date of Patent: Jan. 7, 1997

[54] METHOD OF MANUFACTURING FERROELECTRIC CAPACITOR WITH A HYDROGEN HEAT TREATMENT

[75] Inventors: Toru Nasu; Atsuo Inoue, both of Kyoto; Yoshihisa Nagano, Osaka; Akihiro Matsuda, Osaka; Koji Arita, Osaka, all of Japan

[73] Assignee: Matsushita Electonics Corporation, Osaka, Japan

[21] Appl. No.: 388,502

[22] Filed: Feb. 14, 1995

[30] Foreign Application Priority Data

Feb. 15, 1994 [JP] Japan ................................. 6-018284

[51] Int. Cl.⁶ ............................................. H01L 21/8242
[52] U.S. Cl. ............................. 437/60; 437/937; 437/978
[58] Field of Search ........................... 437/60, 919, 937, 437/978; 148/DIG. 14

[56] References Cited

U.S. PATENT DOCUMENTS

| 4,605,447 | 8/1986 | Brotherton et al. | 437/937 |
| 5,374,578 | 12/1994 | Patel et al. | 437/60 |
| 5,396,095 | 3/1995 | Wolters et al. | 257/310 |

FOREIGN PATENT DOCUMENTS

| 0513894 | 11/1992 | European Pat. Off. |
| 5-183106 | 7/1993 | Japan |

*Primary Examiner*—Chandra Chaudhari
*Attorney, Agent, or Firm*—McDermott, Will & Emery

[57] ABSTRACT

A manufacturing method of a semiconductor device comprises the steps:(a) forming a ferroelectric capacitor on a semiconductor substrate on which a MOS transistor is formed, (b) forming an interlayer insulating film which covers the whole semiconductor substrate, (c) forming first contact holes which reach diffusion layers of the MOS transistor, (d) after forming the first contact holes, providing a heat treatment in hydrogen atmosphere, (e) after the heat treatment, forming second contact holes which reach upper and lower electrodes of the ferroelectric capacitor on the interlayer insulating film, and (f) forming metal interconnection. Since the heat treatment in hydrogen atmosphere is provided before forming the second contact holes, a surface state density at interface between the semiconductor and a gate insulating film of the MOS transistor can be lowered without degrading the characteristics of ferroelectric capacitor.

11 Claims, 2 Drawing Sheets

METHOD OF MANUFACTURING FERROELECTRIC CAPACITOR WITH A HYDROGEN HEAT TREATMENT

FIELD OF THE INVENTION

The present invention relates to a manufacturing method of a semiconductor device having a ferroelectric capacitor.

BACKGROUND OF THE INVENTION

Dynamic Random Access Memory chips (DRAMs) are widely used among semiconductor memory devices because of their high density and low cost. The basic operation of a DRAM is to record data by storing bits as the presence or absence of electrical charge in memory cell capacitors. Silicon oxide film or silicon nitride film is often used as the dielectric film in the memory cell capacitor of the DRAM, but if the memory data is to be nonvolatile, ferroelectric film made of barium titanate and other materials can be used instead.

Other than being used independently, semiconductor memory devices are often used as the memory area of micro computers. These conventional semiconductor memory devices having ferroelectric capacitors are manufactured through the following process:

First, oxide film for separating elements is formed on a silicon substrate, then a Metal Oxide Semiconductor (MOS) transistor comprising diffusion layers, a gate insulating film and a gate electrode is formed. Next, a ferroelectric capacitor fabricated by three layers, namely a lower electrode, ferroelectric film and an upper electrode deposited in this order from the bottom, is formed on the oxide film used for separating elements, and covering the whole silicon substrate is an interlayer insulating film comprising silicon oxide film.

Second, first contact holes reaching to the diffusion layers and second contact holes reaching both to the lower and upper electrodes of the ferroelectric capacitor are formed on the interlayer insulating film. Then heat treatment is provided to the substrate including the above process in an hydrogen atmosphere. Through the first contact holes, metal interconnection contacting the diffusion layers is formed. Also through the second contact holes, metal interconnection contacting both the upper and lower electrodes is formed.

In general, at the manufacturing process of MOS transistors, surface state density on interface between a silicon substrate and the insulating film, gate insulating film among others, formed thereon increases, which degrades transistor characteristics. Therefore, in order to lower the surface state density, the heat treatment in hydrogen atmosphere should be provided without fail. However, when a ferroelectric oxide is used as a dielectric film in a memory cell capacitor, the ferroelectric oxide absorbs hydrogen through the second contact holes during the heat treatment process in hydrogen, which degrades electrical characteristics.

SUMMARY OF THE INVENTION

An object of the present invention is to provide a manufacturing method of a semiconductor memory device, thereby the surface state density in a MOS transistor can be lowered without degrading the characteristics of the ferroelectric film.

A manufacturing method of a semiconductor memory device according to the present invention comprises the steps of:

(a) forming a ferroelectric capacitor made of a lower electrode, ferroelectric film and upper electrode on a semiconductor substrate on which an integrated circuit such as a MOS transistor is formed;

(b) forming an interlayer insulating film which covers the integrated circuit and the ferroelectric capacitor;

(c) forming a first contact hole on the interlayer insulating film, said first contact hole reaching a diffusion layer of the integrated circuit;

(d) after forming the first contact hole, providing heat treatment in hydrogen atmosphere;

(e) after providing the heat treatment, forming second contact holes on the interlayer insulating film, and thereby reaching both the lower and upper electrodes of the ferroelectric capacitor; and (f) forming metal interconnection reaching the diffusion layer of the integrated circuit as well as both the lower and upper electrodes of the ferroelectric capacitor through the first and second contact holes.

According to this manufacturing method, when the heat treatment in hydrogen atmosphere is provided, the second contact holes reaching the ferroelectric capacitor remain unopened.

Therefore, hydrogen barely reaches the ferroelectric capacitor, which prevents the electric characteristic thereof from degrading. On the other hand, hydrogen is supplied through the first contact holes onto the interface between the semiconductor substrate and the gate insulating film, which lowers the surface state density easily.

It is preferable to use a plasma hydrogen when the heat treatment in hydrogen atmosphere is provided. For active hydrogen in the plasma hydrogen further facilitates lowering the surface state density better than in a simple hydrogen atmosphere.

It is also preferable to use the interlayer insulating film made of a silicon nitride film. Since the silicon nitride film is dense enough to protect the ferroelectric film from hydrogen gas, the electric characteristic of the ferroelectric film is prevented from degrading in the heat treatment in hydrogen.

DESCRIPTION OF THE PREFERRED EMBODIMENTS

Figure 1A:
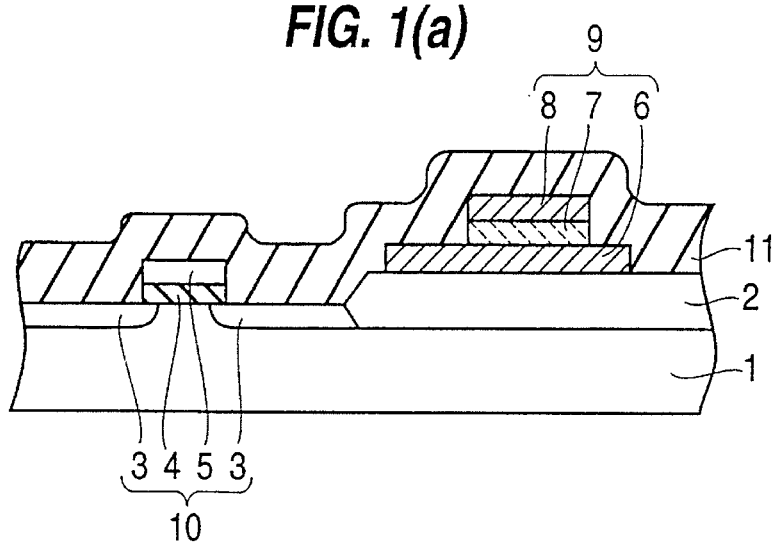
FIGS. 1(a), 1(b), 1(c) and 1(d) are cross sections illustrating a manufacturing process of the semiconductor memory device according to the present invention.

As shown in FIG. 1(a), first, an oxide film 2 for separating elements is formed on a silicon substrate 1, then a MOS transistor 10 comprising diffusion layers 3, gate insulating film 4 and gate electrode 5 is formed. The MOS transistor 10 may be formed by a regular manufacturing method of a semiconductor. Further, on the oxide film 2 for separating elements, a lower electrode 6, a ferroelectric film 7 made of barium titanate and an upper electrode 8 are deposited successively by a sputtering method and they are formed into a ferroelectric capacitor 9. After that, the silicon substrate 1 on which the MOS transistor 10 and ferroelectric capacitor 9 are formed is covered entirely by an interlayer insulating film 11 made of a NSG (nondoped silicate glass) film by a chemical vapor deposition (CVD) method. A PSG (phosph-silicate glass) film can be used as the interlayer insulating film 11 instead of NSG film, or a BPSG (borophosph-silicate glass) film can be used.

Figure 1B:
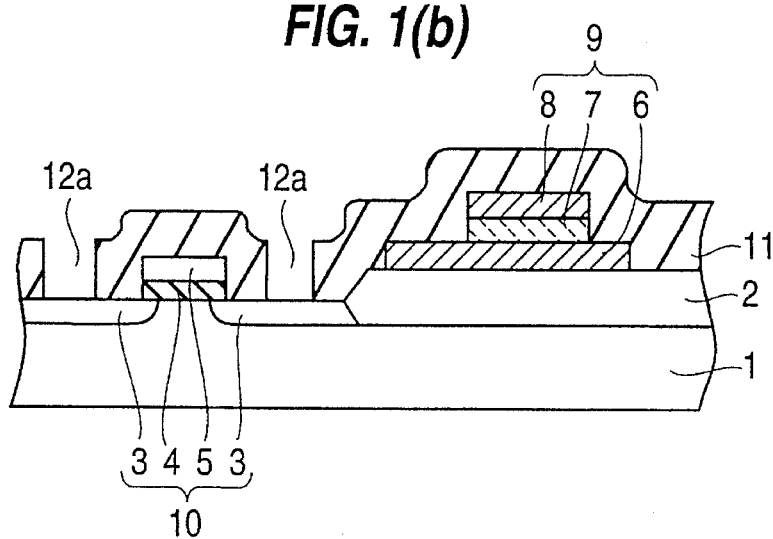

Second, as shown in FIG. 1(b), first contact holes 12a reaching diffusion layers 3 of the MOS transistor are formed by an etching technique on the interlayer insulating film 11. Then, heat treatment at 450° C. for 30 minutes is provided in hydrogen atmosphere.

In this heat treatment in hydrogen atmosphere, since the ferroelectric capacitor 9 is covered by the interlayer insulating film 11, hydrogen barely reaches the ferroelectric film 7. On the other hand, hydrogen easily reaches the MOS transistor 10 through the first contact holes 12a. Accordingly, the surface state density on the interface between the silicon substrate 1 and gate insulating film 4 can be lowered without degrading the characteristics of the ferroelectric capacitor 9.

When providing the heat treatment, a temperature ranging from 350° C. to 550° C. is preferred. The surface state density on the phase boundary between the silicon substrate 1 and gate insulating film 4 critically increases in the course of forming various films, but this increased surface state density is lowered by a heat treatment in a short time at a relatively low temperature. Transistor characteristics thus recover with ease. Also a heat treatment at a lower temperature less degrades characteristics of the ferroelectric capacitor 9.

Figure 1C:
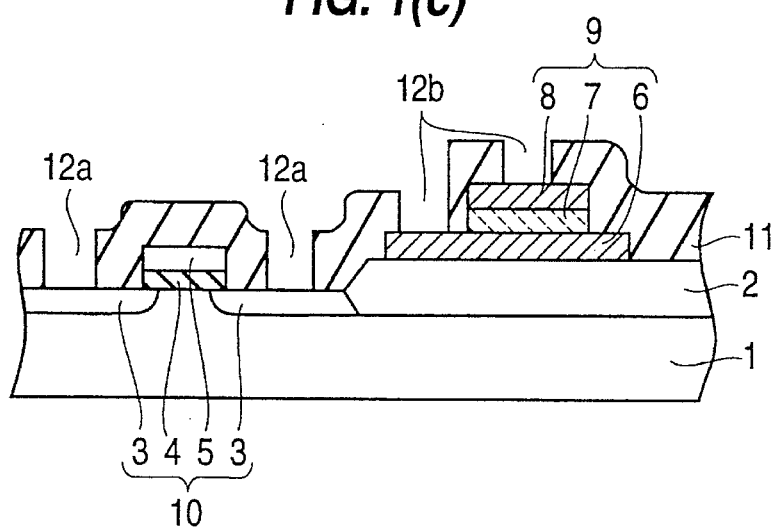

Third, as shown in FIG. 1(c), second contact holes 12b which reach the lower electrode 6 and upper electrode 8 of the ferroelectric capacitor 9 are formed on the interlayer insulating film 11.

Figure 1D:
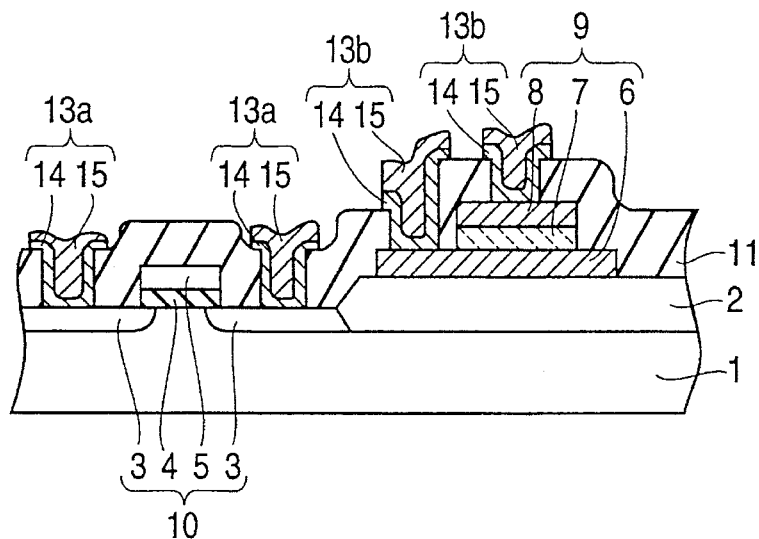

Fourth, as shown in FIG. 1(d), metal interconnection 13a contacting the diffusion layers 3 through the first contact holes 12a is formed, and metal interconnection 13b contacting the lower electrode 6 as well as upper electrode 8 through the second contact holes 12b is formed. Both metal interconnections can be formed with a regular technique of metal interconnection. The metal interconnections 13a and 13b have two layers, namely, a first layer 14 made of titanium-tungsten alloy and a second layer 15 made of aluminum alloy. Further, although omitted to illustrate in FIG. 1(d), the metal interconnection 13a and 13b are covered by a protective film, and a window is provided thereon so that the metal interconnections 13a and 13b may connect with the outside, which means forming a bonding pad.

In this manufacturing method, when providing a heat treatment in hydrogen atmosphere, the second contact holes 12b which reach the lower electrode 6 and upper electrode 8 of the ferroelectric capacitor 9, remain unopened. Hydrogen thus barely reaches the ferroelectric film 7, which prevents the electric characteristic of the ferroelectric film 7 from degrading.

On the other hand, since hydrogen is supplied to the interface between the semiconductor substrate 1 and gate insulating film 4 through the first contact holes 12a, the surface state density is lowered with ease.

In the above manufacturing method, a heat treatment in hydrogen atmosphere is used. Hereafter, a heat treatment in plasma hydrogen atmosphere is explained.

First, the material before being processed by the heat treatment in hydrogen is placed at a plasma apparatus, and hydrogen is generated under 0.05 Torr decompressed atmospheric pressure and processed for 30 minutes. In this plasma hydrogen atmosphere, since the material is exposed to active hydrogen, the surface state density can be lowered more easily than in normal hydrogen atmosphere. The preferable atmospheric pressure used in the plasma hydrogen process ranges from 0.01 to 0.1 Torr, where the surface state density can be easily lowered.

In the above manufacturing methods, the interlayer film 11 comprising NSG film is formed, however, silicon nitride film is preferred to NSG film for forming the interlayer film. In this case, after forming the oxide film for separating elements, MOS transistor and ferroelectric capacitor are formed on the silicon substrate, silicon nitride film is formed by a low pressure CVD method. This silicon nitride film is formed in 0.5 Tort mixed gas of silane dichloride (SiH2Cl2) and ammonia (NH3) at 750° C. By using a conventional etching technique, the first contacting holes which reach the diffusion layers of MOS transistor are formed on the silicon nitride film, arid then a heat treatment in hydrogen or plasma hydrogen atmosphere is provided same as the above manufacturing method.

Next, the second contact holes which reach both the lower and upper electrodes of the ferroelectric capacitor are formed on the silicon nitride film, then the same type of metal interconnection as the above described manufacturing method is provided.

In the forming process of the silicon nitride film, besides the above mentioned mixed gas, a mixed gas of mono-silane (SiH4) and ammonia, or a mixed gas of disilane (Si2H6) and ammonia can be used. A preferable forming temperature ranges from 700° to 800° C.

When using silicon nitride film as the interlayer insulating film, hydrogen affects the material less than using NSG film because silicon nitride film is more dense. When using silicon nitride film, the characteristics of the ferroelectric capacitor is thus hard to deteriorate. The CVD method under low pressure has little affect on the transistor characteristics of the MOS transistor. Therefore, the heat treatment in hydrogen can be provided with ease.

Figure 2A:
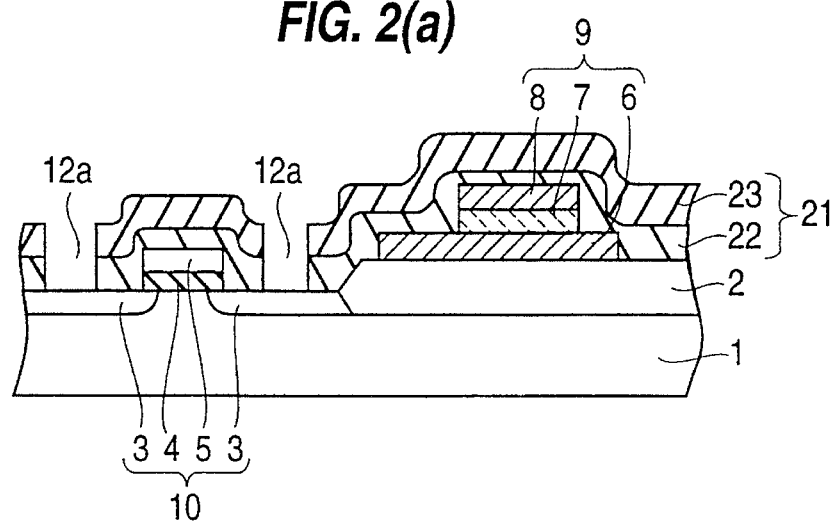
FIGS. 2(a) and 2(b) are cross sections illustrating the other manufacturing process of the semiconductor memory device according to the present invention.
Figure 2B:
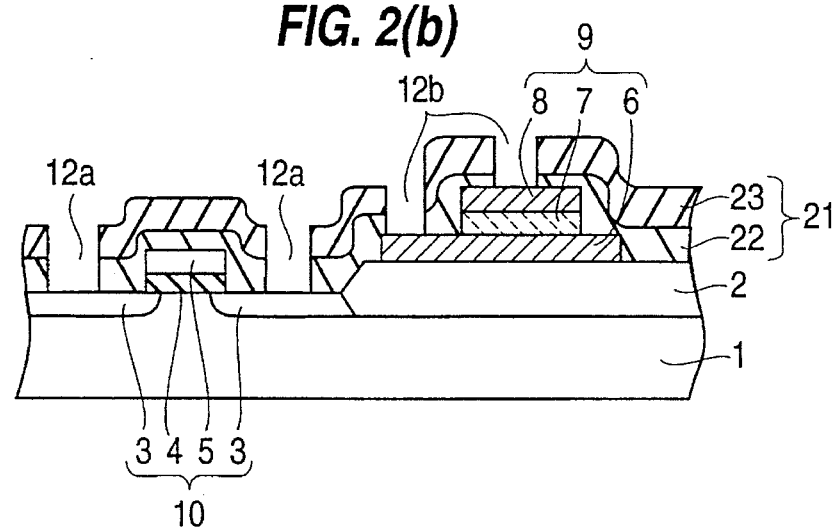

FIGS. 2(a) and 2(b) illustrate that the interlayer insulating film 21 is deposited by two layers, namely, silicon nitride film 22 and PSG film 23. In this case, as shown in FIG. 2(a), the same manufacturing method as the above is taken: On the silicon substrate 1, the oxide film 2 for separating elements, MOB transistor 10 and ferroelectric capacitor 9 are formed, further, the silicon nitride film 22 is also formed. Then, on this silicon nitride film, PSG film 23 is formed with CVD method, and the first contact holes 12a which reach the diffusion layers 3 are formed with the etching technique on the interlayer insulating film 21, and the heat treatment in hydrogen atmosphere is provided same as the above described manufacturing method.

Next, as shown in FIG. 2(b), the second contact holes 12b which reach both the lower electrode 6 and upper electrode 8 of the ferroelectric capacitor 9 are formed on the interlayer insulating film 21. Then the same type of metal interconnection is provided as the above described manufacturing method.

The interlayer insulating film 21 fabricated by two layers, namely, the silicon nitride film 22 and PSG film 23, can prevent influence of hydrogen at the heat treatment in hydrogen atmosphere as well as characteristics deterioration of the ferroelectric capacitor 9.

The two-layer structure can be made of not only the combination of silicon nitride film and PSG film, but also another combination such as silicon nitride film and NSG film, or silicon nitride film and BPSG film. The interlayer insulating film may be fabricated by three layers or more including silicon nitride film and other insulating films, for example, silicon nitride film, BPSG film and silicon nitride film successively deposited.

In the above exemplary embodiments, the low pressure CVD method is used when forming the silicon nitride film, however, the sputtering method can be also used. When using the sputtering method to form the silicon nitride film, sputtering in argon gas by using sintered target of the silicon nitride, or sputtering in a mixed gas of nitrogen and argon by using silicon target is preferable. The silicon nitride film formed by the sputtering method is dense, which can prevent the characteristics of the ferroelectric film from degrading.

The present invention is not limited to the above exemplary embodiments. For example, the above exemplary embodiments show the semiconductor memory device with one peace of MOS transistor formed on the silicon substrate. However, the present invention covers a semiconductor memory device with an integrated circuit comprising a plurality of MOS transistors on the silicon substrate. Also the present invention is not limited to the semiconductor memory device, but also covers a semiconductor device having the ferroelectric capacitor. Further, the ferroelectric film is not limited to be ferroelectric oxide of barium titanate, but may be other ferroelectric materials such as strontium titanate, lead titanate and barium strontium-titanate. Therefore, various modification may be produced in the details within the scope and range of the claims without departing from the spirit of this invention.

What is claimed is:

1. A manufacturing method of a semiconductor device comprising the steps of:

(a) forming a ferroelectric capacitor made of a lower electrode, a ferroelectric film and an upper electrode, on a semiconductor substrate on which an integrated circuit having a diffusion layer is formed;

(b) forming an interlayer insulating film which covers said integrated circuit and said ferroelectric capacitor;

(c) forming a first contact hole which reaches said diffusion layer, on said interlayer insulating film;

(d) after forming said first contact hole, providing a heat treatment in hydrogen atmosphere;

(e) after providing said heat treatment, forming second contact holes which reach said lower and upper electrodes, on said interlayer insulating film;

(f) forming metal interconnection which reach said diffusion layer, said lower and upper electrodes, through said first and second contact holes.

2. The manufacturing method according to claim 1 wherein said heat treatment is provided at a temperature ranging from 350° C. to 550° C.

3. The manufacturing method according to claim 1 wherein said heat treatment is provided in plasma hydrogen atmosphere.

4. The manufacturing method according to claim 3 wherein said heat treatment in plasma hydrogen is provided at atmospheric pressure ranging from 0.01 to 0.1 Torr.

5. The manufacturing method according to claim 1 wherein said step of forming the interlayer insulating film comprises a step of forming a silicon nitride film.

6. The manufacturing method according to claim 5 wherein said step of forming the silicon nitride film uses a low pressure CVD method.

7. The manufacturing method according to claim 5 wherein said step of forming the silicon nitride film uses a sputtering method.

8. The manufacturing method according to claim 1 wherein said step of forming an interlayer insulating film comprises a step of forming a multilayer film including a silicon nitride film.

9. The manufacturing method according to claim 8 wherein said step of forming the multilayer film uses a low pressure CVD method.

10. The manufacturing method according to claim 8 wherein said step of forming the multilayer film uses a sputtering method.

11. The manufacturing method according to claim 8 wherein said step of forming the multilayer film comprises a step of forming dual layers fabricated by a silicon nitride film and a silicon oxide film including phosphorus.

* * * * *